(12) United States Patent
Panikkath et al.

(10) Patent No.: US 8,712,357 B2
(45) Date of Patent: Apr. 29, 2014

(54) LO GENERATION WITH DESKEWED INPUT OSCILLATOR SIGNAL

(75) Inventors: Vinod V. Panikkath, San Diego, CA (US); Prasad S. Gudem, San Diego, CA (US); Steven C. Ciccarelli, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 1030 days.

(21) Appl. No.: 12/270,764

(22) Filed: Nov. 13, 2008

(65) Prior Publication Data

US 2010/0120390 A1 May 13, 2010

(51) Int. Cl.
*H04B 1/16* (2006.01)
(52) U.S. Cl.
USPC .......................................... 455/208; 455/118
(58) Field of Classification Search
None
See application file for complete search history.

(56) References Cited

U.S. PATENT DOCUMENTS

| | | |
|---|---|---|
| 4,061,882 A | 12/1977 | Dorren |
| 4,333,020 A | 6/1982 | Maeder |
| 4,555,777 A | 11/1985 | Poteet |
| 4,623,801 A | 11/1986 | Rocchi |
| 4,716,320 A | 12/1987 | McAdams |
| 4,959,557 A | 9/1990 | Miller |
| 4,995,589 A | 2/1991 | Adishian et al. |
| 5,097,157 A | 3/1992 | Jaffe et al. |
| 5,103,114 A | 4/1992 | Fitch |
| 5,103,116 A | 4/1992 | Sivilotti et al. |
| 5,103,144 A | 4/1992 | Dunham |
| 5,192,875 A | 3/1993 | Kielmeyer, Jr. |
| 5,375,258 A | 12/1994 | Gillig |
| 5,477,180 A | 12/1995 | Chen |
| 5,534,803 A | 7/1996 | Correale, Jr. et al. |
| 5,682,109 A | 10/1997 | Ohmi et al. |
| 5,708,399 A | 1/1998 | Fujii et al. |
| 5,983,082 A | 11/1999 | Hilbert |

(Continued)

FOREIGN PATENT DOCUMENTS

| | | |
|---|---|---|
| CN | 1412947 A | 4/2003 |
| EP | 0398751 A2 | 11/1990 |

(Continued)

OTHER PUBLICATIONS

International Search Report and Written Opinion—PCT/US2009/064456, International Search Authority—European Patent Office—Aug. 3, 2010.

(Continued)

*Primary Examiner* — Cassandra Cox
(74) *Attorney, Agent, or Firm* — S. Hossain Beladi

(57) ABSTRACT

Techniques for generating local oscillator (LO) signals are described. In one design, an apparatus may include a deskew circuit and a divider circuit. The deskew circuit may receive a differential input oscillator signal having timing skew and provide a differential output oscillator signal having reduced timing skew. The differential input oscillator signal may include first and second input oscillator signals, and the differential output oscillator signal may include first and second output oscillator signals. In one design, the deskew circuit may include first and second variable delay circuits that receive the first and second input oscillator signals, respectively, and provide the first and second output oscillator signals, respectively. Each output oscillator signal may have an adjustable delay selected to reduce timing skew. The divider circuit may divide the differential output oscillator signal in frequency and provide differential I and Q divided signals, which may be used to generate LO signals.

23 Claims, 9 Drawing Sheets

(56) References Cited

U.S. PATENT DOCUMENTS

| | | |
|---|---|---|
| 5,994,935 A | 11/1999 | Ueda et al. |
| 6,014,047 A | 1/2000 | Dreps et al. |
| 6,037,816 A | 3/2000 | Yamauchi |
| 6,057,823 A | 5/2000 | Aoki et al. |
| 6,166,571 A | 12/2000 | Wang |
| 6,169,434 B1 | 1/2001 | Portmann |
| 6,188,291 B1 | 2/2001 | Gopinathan et al. |
| 6,191,629 B1 | 2/2001 | Bisanti et al. |
| 6,239,640 B1 | 5/2001 | Liao et al. |
| 6,310,501 B1 | 10/2001 | Yamashita |
| 6,316,987 B1 | 11/2001 | Dally et al. |
| 6,320,418 B1 | 11/2001 | Fujii et al. |
| 6,320,438 B1 | 11/2001 | Arcus |
| 6,420,921 B1 | 7/2002 | Okayasu et al. |
| 6,426,660 B1 | 7/2002 | Ho et al. |
| 6,433,589 B1 | 8/2002 | Lee |
| 6,542,015 B2 | 4/2003 | Zhou et al. |
| 6,593,789 B2 | 7/2003 | Atallah et al. |
| 6,661,269 B2 | 12/2003 | Simon et al. |
| 6,667,703 B1 | 12/2003 | Reuveni et al. |
| 6,674,772 B1 | 1/2004 | Dally et al. |
| 6,831,497 B2 | 12/2004 | Koh et al. |
| 6,836,240 B1 | 12/2004 | Dubbert et al. |
| 6,897,696 B2 | 5/2005 | Chang |
| 6,904,538 B2 | 6/2005 | Glas et al. |
| 6,933,759 B1 | 8/2005 | Wu et al. |
| 6,967,514 B2 | 11/2005 | Kizer et al. |
| 7,075,377 B2 | 7/2006 | Metaxakis |
| 7,099,643 B2 | 8/2006 | Lin |
| 7,110,469 B2 | 9/2006 | Shi et al. |
| 7,184,512 B2 | 2/2007 | Takeshita et al. |
| 7,239,209 B2 * | 7/2007 | Adan .................. 331/117 R |
| 7,271,622 B2 | 9/2007 | Metaxakis |
| 7,298,222 B2 | 11/2007 | Rosik et al. |
| 7,307,461 B2 | 12/2007 | Nguyen et al. |
| 7,315,220 B1 | 1/2008 | Robinson et al. |
| 7,323,944 B2 | 1/2008 | Florescu et al. |
| 7,336,114 B2 | 2/2008 | Razavi et al. |
| 7,352,229 B1 | 4/2008 | Mei et al. |
| 7,388,416 B2 | 6/2008 | Marutani |
| 7,423,468 B2 | 9/2008 | Cho |
| 7,457,605 B2 | 11/2008 | Thompson et al. |
| 7,474,715 B1 | 1/2009 | Ni et al. |
| 7,521,976 B1 | 4/2009 | Sudjian et al. |
| 7,554,380 B2 | 6/2009 | Embabi et al. |
| 7,580,483 B2 | 8/2009 | Ibrahim et al. |
| 7,603,094 B2 | 10/2009 | Rahman et al. |
| 7,616,938 B2 | 11/2009 | Behzad et al. |
| 7,619,456 B2 | 11/2009 | Kim et al. |
| 7,656,205 B2 | 2/2010 | Chen et al. |
| 7,683,682 B1 | 3/2010 | Won et al. |
| 7,693,230 B2 | 4/2010 | Sorrells et al. |
| 7,715,836 B2 | 5/2010 | Vassiliou et al. |
| 7,750,708 B2 * | 7/2010 | Gschier .................. 327/238 |
| 7,750,749 B2 * | 7/2010 | Jones .................... 332/105 |
| 7,768,330 B2 | 8/2010 | Yuuki et al. |
| 7,808,329 B2 | 10/2010 | Azadet et al. |
| 7,821,315 B2 | 10/2010 | Bossu et al. |
| 7,932,844 B1 * | 4/2011 | Huynh et al. ............ 341/120 |
| 7,965,111 B2 | 6/2011 | Sun et al. |
| 8,095,103 B2 * | 1/2012 | Asuri .................... 455/313 |
| 8,164,361 B2 | 4/2012 | Soltanian et al. |
| 8,248,132 B2 | 8/2012 | Chang |
| 2001/0050583 A1 | 12/2001 | Fulkerson |
| 2002/0000834 A1 | 1/2002 | Ooishi |
| 2002/0079938 A1 | 6/2002 | Saeki |
| 2002/0113270 A1 | 8/2002 | Bernstein et al. |
| 2002/0160740 A1 | 10/2002 | Hatcher et al. |
| 2003/0042957 A1 | 3/2003 | Tamura |
| 2003/0102926 A1 | 6/2003 | Hsieh |
| 2004/0008092 A1 * | 1/2004 | Hajimiri et al. ......... 331/117 R |
| 2004/0036541 A1 | 2/2004 | Fang et al. |
| 2004/0051397 A1 | 3/2004 | Juntunen et al. |
| 2004/0147238 A1 | 7/2004 | Wang et al. |
| 2004/0212741 A1 | 10/2004 | Hijikata et al. |
| 2005/0024097 A1 | 2/2005 | Sim et al. |
| 2005/0122149 A1 | 6/2005 | Cho et al. |
| 2005/0174157 A1 | 8/2005 | Calo et al. |
| 2006/0035617 A1 | 2/2006 | Kim |
| 2006/0059376 A1 | 3/2006 | Ngo et al. |
| 2006/0067424 A1 | 3/2006 | Wolf |
| 2006/0119446 A1 | 6/2006 | Li et al. |
| 2007/0037544 A1 | 2/2007 | Heikkinen |
| 2007/0076832 A1 | 4/2007 | Matsudera |
| 2007/0239319 A1 | 10/2007 | Inukai et al. |
| 2007/0242548 A1 | 10/2007 | Tonti et al. |
| 2007/0273485 A1 | 11/2007 | Balachandran et al. |
| 2007/0285120 A1 | 12/2007 | Venditti et al. |
| 2008/0001645 A1 | 1/2008 | Kuroki |
| 2008/0032646 A1 | 2/2008 | Huang et al. |
| 2008/0048736 A1 | 2/2008 | Ruy |
| 2008/0061894 A1 | 3/2008 | Raita et al. |
| 2008/0074148 A1 | 3/2008 | Srivastava et al. |
| 2008/0096508 A1 | 4/2008 | Luff |
| 2008/0106313 A1 | 5/2008 | Keady et al. |
| 2008/0116902 A1 | 5/2008 | Kim et al. |
| 2008/0132195 A1 | 6/2008 | Maxim et al. |
| 2008/0180139 A1 | 7/2008 | Natonio et al. |
| 2008/0225169 A1 | 9/2008 | Takita et al. |
| 2008/0231379 A1 | 9/2008 | Jang et al. |
| 2008/0258781 A1 | 10/2008 | Song et al. |
| 2009/0033430 A1 | 2/2009 | Jang et al. |
| 2009/0066157 A1 | 3/2009 | Tarng et al. |
| 2009/0102520 A1 | 4/2009 | Lee et al. |
| 2009/0108885 A1 | 4/2009 | Natonio et al. |
| 2009/0131006 A1 | 5/2009 | Wu |
| 2009/0154595 A1 | 6/2009 | Choksi et al. |
| 2009/0156135 A1 | 6/2009 | Kamizuma et al. |
| 2009/0184741 A1 | 7/2009 | Suda et al. |
| 2009/0256596 A1 | 10/2009 | Oh |
| 2009/0284288 A1 | 11/2009 | Zhang et al. |
| 2009/0284311 A1 | 11/2009 | Ito |
| 2009/0310711 A1 | 12/2009 | Chiu et al. |
| 2010/0012648 A1 | 1/2010 | Gustafsson et al. |
| 2010/0120390 A1 | 5/2010 | Panikkath et al. |
| 2010/0130139 A1 | 5/2010 | Panikkath et al. |
| 2010/0194485 A1 | 8/2010 | Chawla et al. |
| 2010/0198540 A1 | 8/2010 | Yanagisawa et al. |
| 2010/0226459 A1 | 9/2010 | Park et al. |
| 2011/0001522 A1 | 1/2011 | Chan et al. |
| 2011/0012648 A1 | 1/2011 | Qiao et al. |
| 2011/0043291 A1 | 2/2011 | Fagg |
| 2011/0050296 A1 | 3/2011 | Fagg |
| 2011/0181330 A1 | 7/2011 | Oh |
| 2013/0012150 A1 | 1/2013 | Panikkath et al. |
| 2013/0271188 A1 | 10/2013 | Chan |

FOREIGN PATENT DOCUMENTS

| | | |
|---|---|---|
| EP | 0637134 A1 | 2/1995 |
| EP | 0872956 A2 | 10/1998 |
| EP | 1345317 A2 | 9/2003 |
| EP | 1394944 | 3/2004 |
| EP | 1416691 A1 | 5/2004 |
| EP | 1655591 A1 | 5/2006 |
| EP | 1679796 A1 | 7/2006 |
| EP | 2294691 A2 | 3/2011 |
| FR | 2670975 A1 | 6/1992 |
| GB | 2321144 A | 7/1998 |
| JP | 53048401 A | 5/1978 |
| JP | 59008112 A | 1/1984 |
| JP | 62141219 U | 9/1987 |
| JP | 63078610 A | 4/1988 |
| JP | H0194723 A | 4/1989 |
| JP | 2058951 A | 2/1990 |
| JP | 2060330 U | 5/1990 |
| JP | 2131615 A | 5/1990 |
| JP | H03262317 A | 11/1991 |
| JP | 5268000 A | 10/1993 |
| JP | 7170162 A | 7/1995 |
| JP | 9046195 A | 2/1997 |
| JP | 9191238 A | 7/1997 |
| JP | 10111674 A | 4/1998 |
| JP | 10247842 A | 9/1998 |

(56) References Cited

FOREIGN PATENT DOCUMENTS

| | | | |
|---|---|---|---|
| JP | 2000332583 A | 11/2000 |
| JP | 2001245007 A | 9/2001 |
| JP | 2001312328 A | 11/2001 |
| JP | 2001313228 A | 11/2001 |
| JP | 2002043900 A | 2/2002 |
| JP | 2002064367 A | 2/2002 |
| JP | 2003101397 A | 4/2003 |
| JP | 2003512752 A | 4/2003 |
| JP | 2003224471 A | 8/2003 |
| JP | 2004531126 A | 10/2004 |
| JP | 2004336822 A | 11/2004 |
| JP | 2005110080 A | 4/2005 |
| JP | 2006093748 A | 4/2006 |
| JP | 2006115148 A | 4/2006 |
| JP | 2006173897 A | 6/2006 |
| JP | 2006217563 A | 8/2006 |
| JP | 2006287819 A | 10/2006 |
| JP | 2006314029 A | 11/2006 |
| JP | 2007102483 A | 4/2007 |
| JP | 2008029008 A | 2/2008 |
| JP | 2008054134 A | 3/2008 |
| JP | 2008124836 A | 5/2008 |
| JP | 2010003925 A | 1/2010 |
| JP | 2010539819 A | 12/2010 |
| KR | 20050055925 A | 6/2005 |
| KR | 20080019156 A | 3/2008 |
| TW | 200529566 | 9/2005 |
| TW | 200723676 | 6/2007 |
| TW | 1283515 B | 7/2007 |
| WO | WO9621270 A1 | 7/1996 |
| WO | WO9912259 A2 | 3/1999 |
| WO | WO0129965 A1 | 4/2001 |
| WO | WO0251091 A1 | 6/2002 |
| WO | 02052691 A1 | 7/2002 |
| WO | WO2006033203 A1 | 3/2006 |
| WO | WO2009036397 | 3/2009 |
| WO | WO2009036399 | 3/2009 |
| WO | WO2010068504 | 6/2010 |

OTHER PUBLICATIONS

Partial International Search Report—PCT/US2009/064456, International Search Authority—European Patent Office—Mar. 8, 2010.
Roufoogaran R, et al., "A compact and power efficient local oscillator generation and distribution system for complex multi radio systems" Radio Frequency Integrated Circuits Symposium, 2008. RFIC 2008. IEEE, IEEE, Piscataway, NJ, USA, Jun. 17, 2008, pp. 277-280, XP031284334 ISBN: 978-1-4244-1808-4 *Section 111. Detailed Description*; p. 277-279.
Jun. 2008, pp. 277-280, XP031284334 ISBN: 978-1-4244-1808-4 *Section 111. Detailed Description*; pp. 277-279.
Chan, et al., "Hercules (RTR9800) Divider", Aug. 2005.
Chan, "Hercules (RTR8700) Divider", Aug. 2005.
Co-pending U.S. Appl. No. 13/011,716, filed Jan. 21, 2011.
Navid S et al., "Level-Locked Loop: A Technique for Broadband Quadrature Signal Generation", Custom Integrated Circuits Conference, 1997., Proceedings of the IEEE 1997 Santa Clara, CA, USA May 5-8, 1997, New York, NY, USA, IEEE, US, May 5, 1997, pp. 411-414, XP010235334, DOI: 10.1109/CICC.1997.606656 ISBN: 978-0-7803-3669-8.
Fuse, T et al: "A 1.1V SOI CMOS Frequency Divider Using Body-Inputting SCL Circuit Technology", 2000 IEEE International SOI Conference Proceedings. Wakefield, MA, Oct. 2-5, 2000; [IEEE International SOI Conference], New York, NY : IEEE, US, Oct. 2, 2000, p. 106/107, XP001003452, ISBN: 978-0-7803-6390-8 p. 106; figure 3.
Lee, T.H., et al., "A 2.5 V CMOS delay-locked loop for 18 Mbit, 500 megabyte/s DRAM," Solid-State Circuits, IEEE Journal of, vol. 29, No. 12, pp. 1491-1496, Dec. 1994.
Taiwan Search Report—TW098138733—TIPO—Jun. 17, 2013.

* cited by examiner

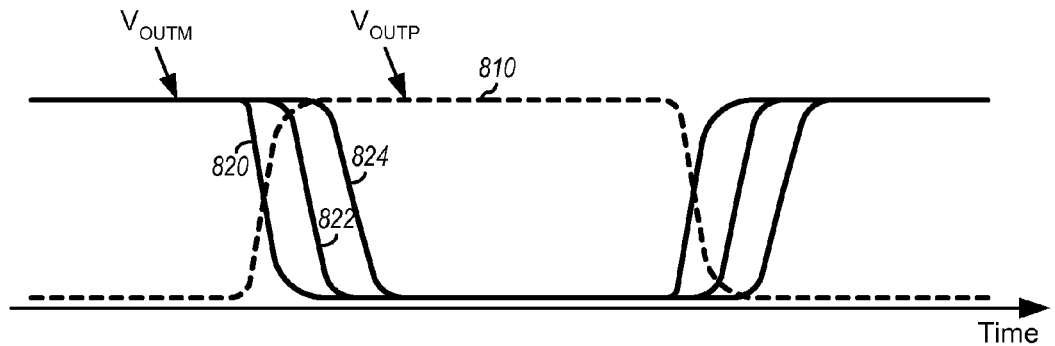
FIG. 8
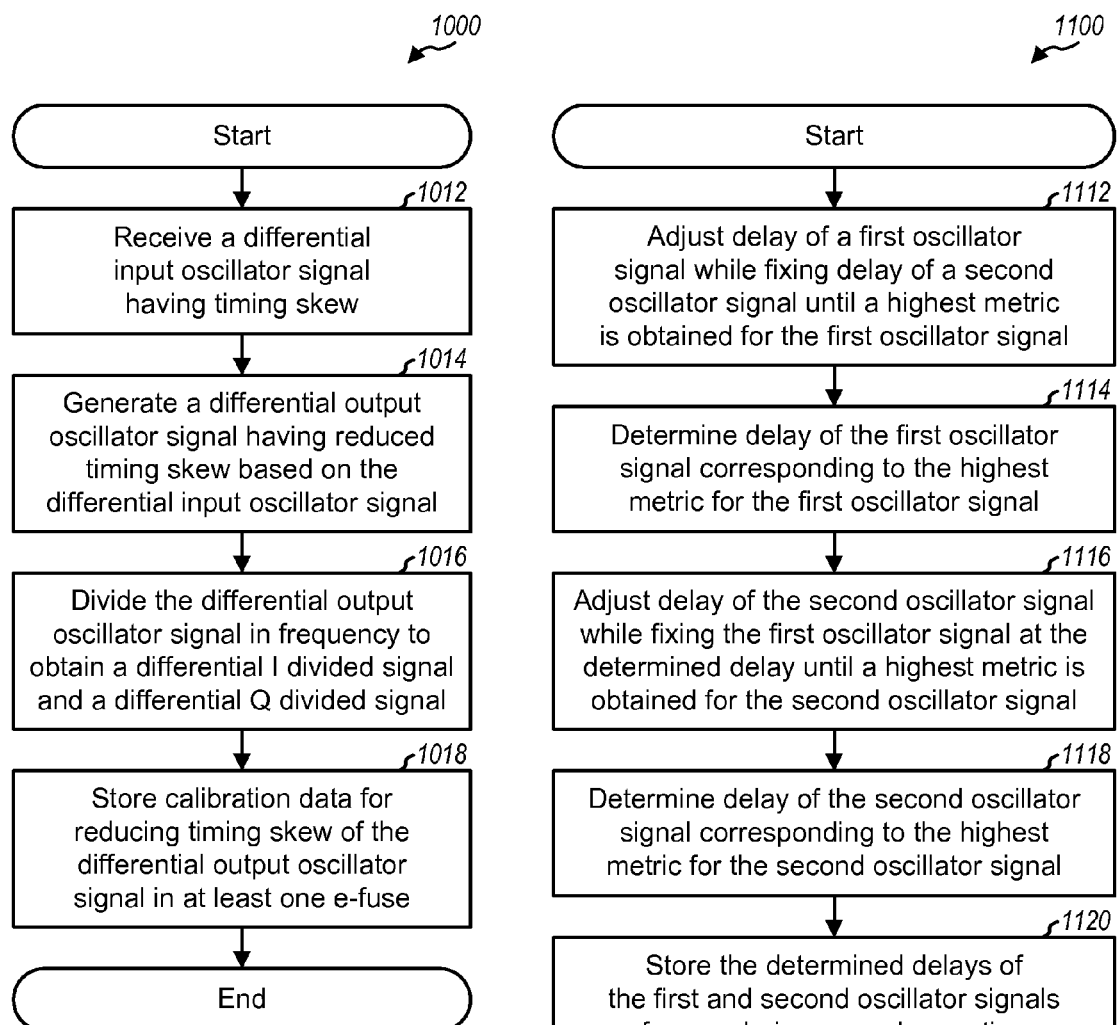
FIG. 10
FIG. 11

LO GENERATION WITH DESKEWED INPUT OSCILLATOR SIGNAL

BACKGROUND

I. Field

The present disclosure relates generally to electronics circuits, and more specifically to techniques for generating local oscillator (LO) signals in a wireless communication device.

II. Background

A wireless communication device such as a cellular phone typically includes a transmitter and a receiver to support bidirectional communication. The transmitter may upconvert output baseband signals with transmit LO signals to obtain an output radio frequency (RF) signal that is more suitable for transmission via a wireless channel. The receiver may receive an input RF signal via the wireless channel and may downconvert the input RF signal with receive LO signals to obtain input baseband signals.

The receiver may include an inphase (I) mixer and a quadrature (Q) mixer to quadrature downconvert the input RF signal. An ideal mixer simply translates an input signal from one frequency to another frequency without distorting the input signal. A practical mixer, however, has non-linear characteristics that can result in generation of various intermodulation components. One such intermodulation component is second order intermodulation (IM2) distortion that is generated by second-order non-linearity of the mixer. IM2 distortion is problematic for a downconversion mixer because the magnitude of the IM2 distortion may be large and the IM2 distortion may fall on top of a desired signal, which may degrade the performance of the receiver.

For second-order non-linearity, the IM2 distortion level increases four folds when an input jammer level doubles. Jammers are large amplitude undesired signals. Second-order intercept point (IP2) is a theoretical point where the IM2 distortion level becomes equal to the desired signal level as the input jammer level is raised. A higher IP2 means lower IM2 distortion for a given input jammer level.

IP2 calibration may be performed for the I and Q mixers in the receiver in order to reduce the amount of IM2 distortion. For IP2 calibration, bias voltages for the I and Q mixers may be varied until either the maximum IP2 or a sufficiently high IP2 is obtained. IP2 calibration is a time consuming process that adds to overall production cost. A receiver with good performance that can avoid IP2 calibration or reduce the complexity of IP2 calibration is thus desirable.

SUMMARY

Techniques for generating LO signals to achieve good performance and to either avoid or simplify IP2 calibration are described herein. An LO signal generator may receive a differential input oscillator signal, e.g., from a voltage controlled oscillator (VCO), and may generate I and Q LO signals for I and Q mixers, respectively. The differential input oscillator signal may have timing/phase skew, which may be a major contributor to IP2 degradation.

In an aspect, the differential input oscillator signal may be deskewed or pre-distorted to correct for the timing skew. In one design, an apparatus may include a deskew circuit and a divider circuit. The deskew circuit may receive the differential input oscillator signal having timing skew and may provide a differential output oscillator signal having reduced timing skew. The differential input oscillator signal may comprise first and second input oscillator signals, and the differential output oscillator signal may comprise first and second output oscillator signals. In one design, the deskew circuit may include a first variable delay circuit that receives the first input oscillator signal and provides the first output oscillator signal having an adjustable delay. The first variable delay circuit may include a buffer and a bias circuit. The buffer may receive the first input oscillator signal and provide the first output oscillator signal. The bias circuit may provide a variable bias current for the buffer to adjust the delay of the buffer. The deskew circuit may further include a second variable delay circuit that receives the second input oscillator signal and provides the second output oscillator signal having an adjustable delay. The divider circuit may divide the differential output oscillator signal in frequency and provide a differential I divided signal and a differential Q divided signal, which may be used to generate LO signals.

In another aspect, calibration data for IP2 calibration, deskewing, etc., may be stored in electronics fuses (e-fuses) on an integrated circuit (IC). The ability to store calibration data in e-fuses may allow calibration to be performed as part of product test at the chip level during manufacturing. In one design, an integrated circuit may include an active circuit, a calibration circuit, and at least one e-fuse. The active circuit may receive at least one bias voltage or current provided to adjust the operation of the active circuit. The calibration circuit may receive calibration data and may generate the at least one bias voltage or current in accordance with the calibration data. The e-fuse(s) may store the calibration data. In one design, the active circuit may comprise a downconversion mixer, the calibration circuit may comprise a bias circuit, and the calibration data may be determined based on IP2 performance of the mixer. In another design, the active circuit may comprise a deskew circuit, the calibration circuit may comprise a bias circuit, and the calibration data may be determined based on timing skew of a differential input oscillator signal.

Various aspects and features of the disclosure are described in further detail below.

BRIEF DESCRIPTION OF THE DRAWINGS

FIG. 8 shows plots of an output oscillator signal with different amounts of delay.

FIG. 10 shows a process for LO generation.

FIG. 11 shows a process for deskewing an input oscillator signal.

DETAILED DESCRIPTION

The techniques described herein may be used for various electronics devices such as wireless communication devices, cellular phones, personal digital assistants (PDAs), handheld devices, wireless modems, laptop computers, cordless phones, Bluetooth devices, broadcast receivers, etc. For clarity, certain aspects of the techniques are described below for a wireless communication device, which may be a cellular phone or some other device.

Figure 1:
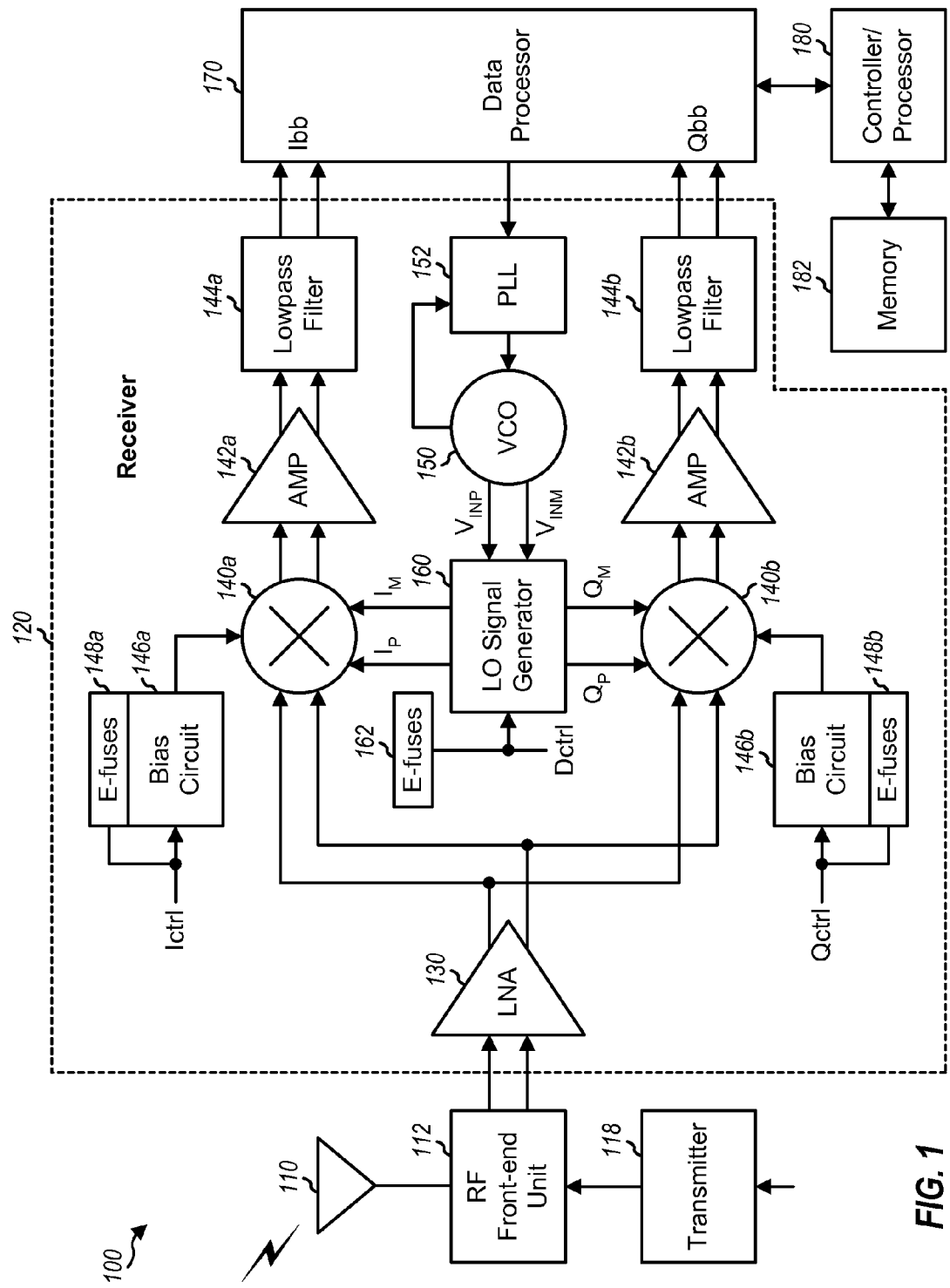
FIG. 1 shows a block diagram of a wireless communication device.

FIG. 1 shows a block diagram of a design of a wireless communication device 100, which includes a transmitter 118 and a receiver 120. In general, wireless device 100 may include any number of transmitters and any number of receivers for any number of communication systems and any number of frequency bands. The techniques described herein may be used for LO generation for receivers as well as transmitters. For clarity, much of the description below is for LO generation for a receiver.

A receiver may be implemented with a super-heterodyne architecture or a direct-conversion architecture. In the super-heterodyne architecture, an input RF signal is downconverted from RF to baseband in multiple stages, e.g., from RF to intermediate frequency (IF) in one stage, and then from IF to baseband in another stage. In the direct-conversion architecture, which is also referred to as a zero-IF architecture, an input RF signal is downconverted from RF directly to baseband in one stage. The super-heterodyne and direct-conversion architectures may use different circuit blocks and/or have different requirements. The techniques described herein may be used for both the super-heterodyne and direct-conversion architectures. In the design shown in FIG. 1, receiver 120 is implemented with the direct-conversion architecture.

In the receive path, an antenna 110 may receive signals from base stations, satellites, and/or other transmitter stations and may provide a received RF signal to an RF front-end unit 112. Unit 112 may include one or more switches, filters, duplexers, diplexers, baluns, etc. A filter may pass signal components in a designated frequency range and attenuate undesired components outside of this frequency range. A diplexer may route a received RF signal at a first frequency from antenna 110 to receiver 120 and may route an output RF signal at a second frequency from transmitter 118 to antenna 110. A duplexer may alternately couple antenna 110 to transmitter 118 and receiver 120 on the same frequency. A balun may provide single-ended to differential conversion, impedance transformation, filtering, etc. In the design shown in FIG. 1, unit 112 provides a differential input RF signal to receiver 120.

Within receiver 120, a low noise amplifier (LNA) 130 may amplify the differential input RF signal and provide a differential amplified RF signal to an I mixer 140a and a Q mixer 140a. Mixer 140a may downconvert the differential amplified RF signal with an I LO signal composed of $I_P$ and $I_M$ signals from an LO signal generator 160 and may provide a differential I downconverted signal. The differential I downconverted signal may be amplified by an amplifier (AMP) 142a and further filtered by a lowpass filter 144a to obtain a differential I input baseband signal (Ibb), which may be provided to a data processor 170. Similarly, mixer 140b may downconvert the differential amplified RF signal with a Q LO signal composed of $Q_P$ and $Q_M$ signals from LO generator 160 and may provide a differential Q downconverted signal. The differential Q downconverted signal may be amplified by an amplifier 142b and further filtered by a lowpass filter 144b to obtain a differential Q input baseband signal (Qbb), which may be provided to data processor 170.

Bias circuits 146a and 146b may be used for IP2 calibration of mixers 140a and 140b, respectively. Electronics fuses (e-fuses) 148a and 148b may store calibration data for mixers 140a and 140b, respectively.

LO signal generator 160 may receive a differential input VCO signal composed of $V_{INP}$ and $V_{INM}$ signals from a VCO 150. LO signal generator 160 may generate the I LO signal for mixer 140a and the Q LO signal for mixer 140b. A phase locked loop (PLL) 152 may receive a frequency control indicating a desired frequency. PLL 152 may generate a control voltage for VCO 150 to obtain the desired frequency for the differential input VCO signal. The $V_{INP}$ and $V_{INM}$ signals from VCO 150 may have timing skew. LO signal generator 160 may correct for the timing skew in order to obtain good performance for mixers 140a and 140b, as described below. E-fuses 162 may store skew correction data for LO signal generator 160.

FIG. 1 shows an example design of receiver 120. In general, the conditioning of the signals in a receiver may be performed by one or more amplifiers, filters, mixers, etc. These circuit blocks may operate on single-ended signals or differential signals. These circuit blocks may also be arranged differently from the configuration shown in FIG. 1. Furthermore, other circuit blocks not shown in FIG. 1 may be used to condition the signals in a receiver. All or a portion of receiver 120 may be implemented on one or more RF integrated circuits (RFICs), analog ICs, mixed-signal ICs, etc. VCO 150 may be implemented on an IC for receiver 120 or may be external to the IC.

Data processor 170 may include various processing units for data transmission and reception as well as other functions. For example, data processor 170 may include one or more analog-to-digital converters (ADCs), digital-to-analog converters (DACs), digital signal processor (DSPs), reduced instruction set computer (RISC) processors, central processing units (CPUs), etc. A controller/processor 180 may control the operation at wireless device 100. Memory 182 may store program codes and data for wireless device 100. Data processor 170, controller/processor 180, and/or memory 182 may be implemented on one or more application specific integrated circuits (ASICs) and/or other ICs.

Figure 2:
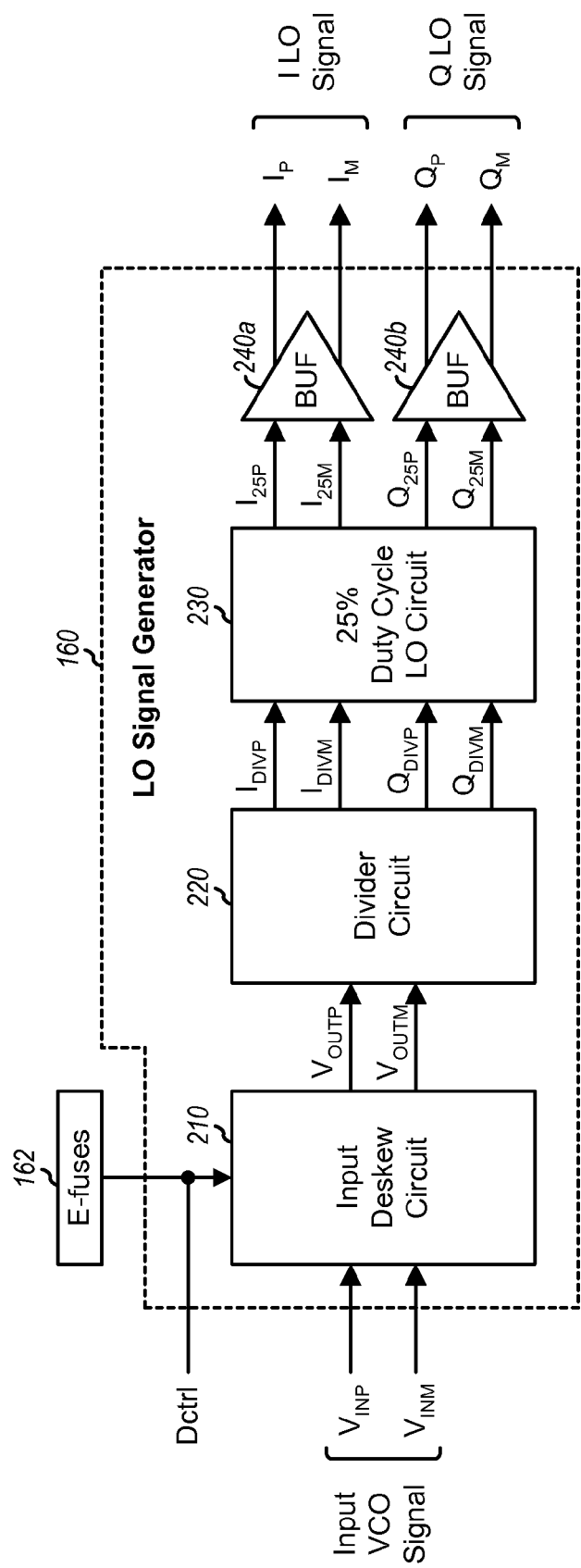
FIG. 2 shows a block diagram of an LO signal generator.

FIG. 2 shows a block diagram of a design of LO signal generator 160 in FIG. 2. Within LO signal generator 160, an input deskew circuit 210 receives, deskews and buffers the differential input VCO signal from VCO 150 and provides a differential output VCO signal composed of $V_{OUTP}$ and $V_{OUTM}$ signals. A divider circuit 220 divides the differential output VCO signal in frequency (e.g., by a factor of two, four, etc.) and provides (i) a differential I divided signal composed of $I_{DIVP}$ and $I_{DIVM}$ signals and (ii) a differential Q divided signal composed of $Q_{DIVP}$ and $Q_{DIVM}$ signals. The I and Q divided signals are in quadrature and 90° out of phase. A 25% duty cycle LO circuit 230 receives the differential I and Q divided signals and generates four LO signals composed of $I_{25P}$, $I_{25M}$, $Q_{25P}$ and $Q_{25M}$ signals having 25% duty cycle and being 90° out of phase of each other. A buffer 240a buffers the $I_{25P}$ and $I_{25M}$ signals and provides the $I_P$ and $I_M$ signals, respectively, for the I LO signal. A buffer 240b buffers the $Q_{25P}$ and $Q_{25M}$ signals and provides the $Q_P$ and $Q_M$ signals, respectively, for the Q LO signal.

Figure 3:
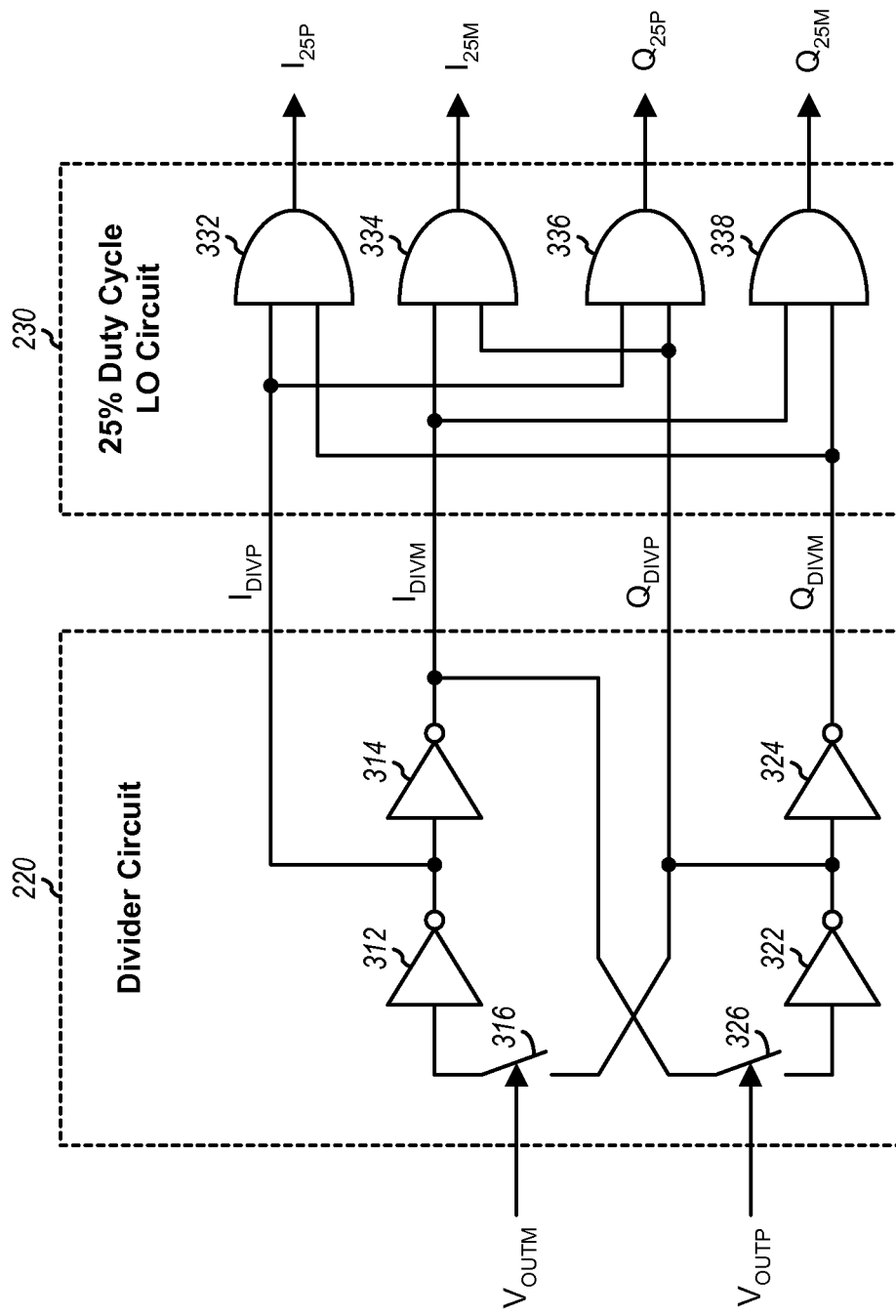
FIG. 3 shows a schematic diagram of a divider circuit and an LO circuit.

FIG. 3 shows a schematic diagram of a design of divider circuit 220 and 25% duty cycle LO circuit 230 in FIG. 2. Within divider circuit 220, inverters 312 and 314 are coupled in series and provide the $I_{DIVP}$ and $I_{DIVM}$ signals, respectively. Inverters 322 and 324 are also coupled in series and provide the $Q_{DIVP}$ and $Q_{DIVM}$ signals, respectively. A switch 316 is coupled between the input of inverter 312 and the output of inverter 322 and is controlled by the $V_{OUTM}$ signal. A switch 326 is coupled between the input of inverter 322 and the output of inverter 314 and is controlled by the $V_{OUTP}$ signal.

Within 25% duty cycle LO circuit 230, an AND gate 332 receives the $I_{DIVP}$ and $Q_{DIVM}$ signals and provides the $I_{25P}$ signal. An AND gate 334 receives the $I_{DIVM}$ and $Q_{DIVP}$ signals and provides the $I_{25M}$ signal. An AND gate 336 receives the $I_{DIVP}$ and $Q_{DIVP}$ signals and provides the $Q_{25P}$ signal. An AND gate 338 receives the $I_{DIVM}$ and $Q_{DIVM}$ signals and provides the $Q_{25M}$ signal.

In the design shown in FIG. 3, divider circuit 220 is implemented with a single-ended dynamic divider. The divider is single-ended in that single-ended signals are passed through inverters 312, 314, 322 and 324 and switches 316 and 326. The divider is dynamic in that no storage elements are used in the divider. The single-ended dynamic divider may have lower power consumption and better noise performance than other types of divider. The single-ended dynamic divider may thus be commonly used for receivers in wireless devices. However, the single-ended dynamic divider may be more susceptible to VCO skew, which is timing skew between the $V_{INP}$ and $V_{INM}$ signals from VCO 150. VCO skew may also be referred to as timing skew, phase skew, input LO skew, timing error, phase error, phase offset, etc. The terms "timing" and "phase" may be used interchangeably. The terms "skew", "error" and "offset" may also be used interchangeably.

Figure 4A:
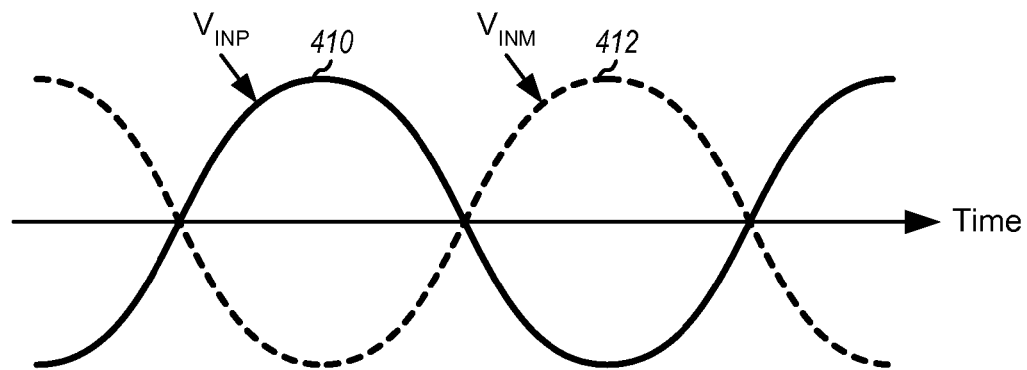
FIGS. 4A and 4B show timing diagrams of a differential input oscillator signal without and with timing skew, respectively.

FIG. 4A shows a timing diagram of the $V_{INP}$ and $V_{INM}$ signals without VCO skew. The $V_{INP}$ signal is shown by a solid line 410, and the $V_{INM}$ signal is shown by a dashed line 412. As shown in FIG. 4A, the $V_{INM}$ signal is 180° out of phase and inverted with respect to the $V_{INP}$ signal when there is no timing skew.

Figure 4B:
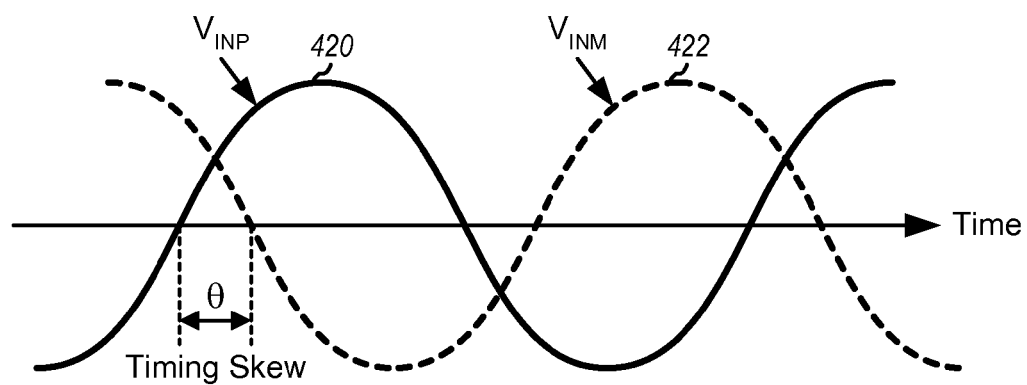

FIG. 4B shows a timing diagram of the $V_{INP}$ and $V_{INM}$ signals with VCO skew. The $V_{INP}$ signal is shown by a solid line 420, and the $V_{INM}$ signal is shown by a dashed line 422. As shown in FIG. 4B, the $V_{INM}$ signal is not 180° out of phase with respect to the $V_{INP}$ signal when there is timing skew. The amount of timing skew may be given in units of degrees and denoted as θ.

Figure 5:
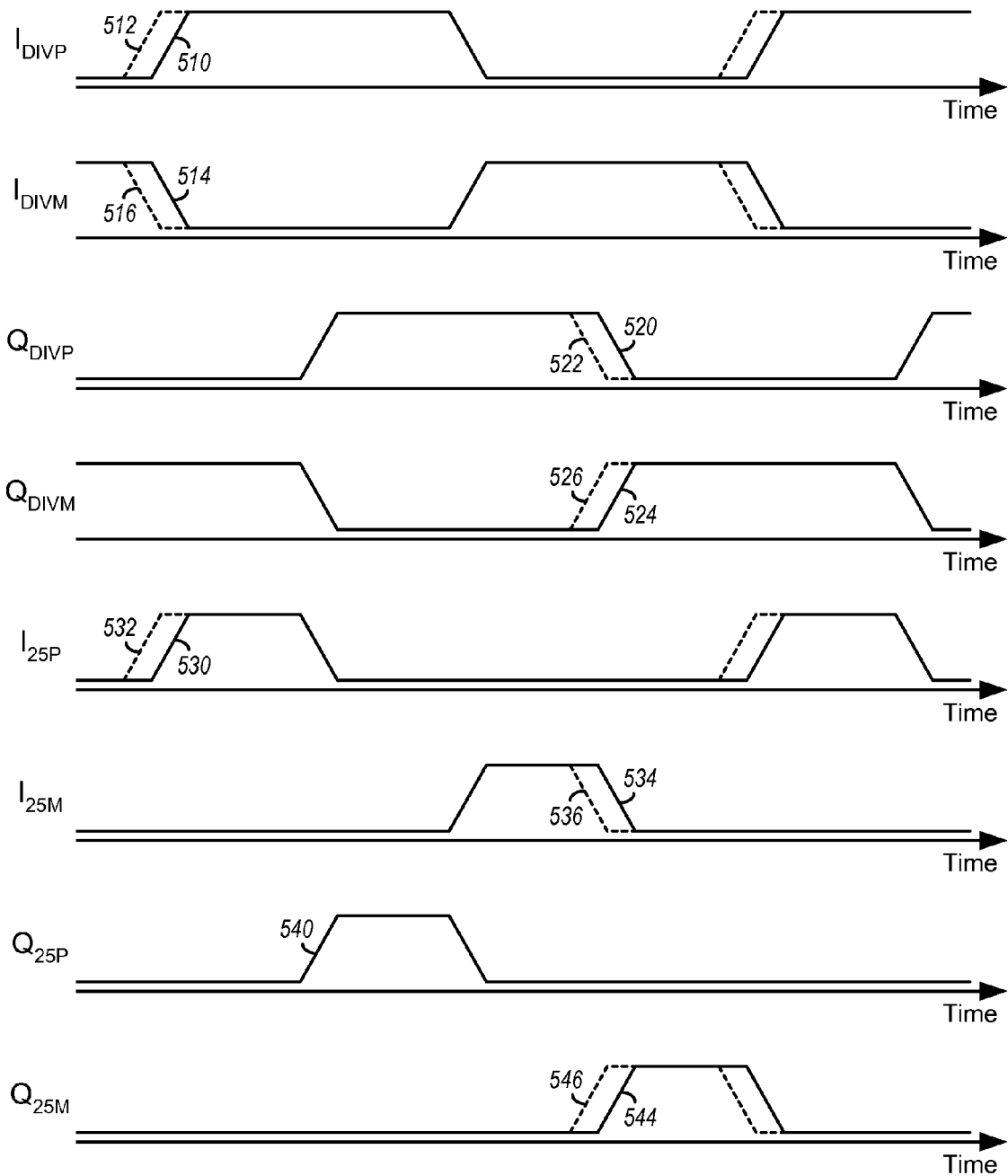
FIG. 5 shows a timing diagram of signals from the divider circuit and the LO circuit.

FIG. 5 shows a timing diagram of the signals provided by divider circuit 220 and 25% duty cycle LO circuit 230 in FIGS. 2 and 3. The top half of FIG. 5 shows the $I_{DIVP}$, $I_{DIVM}$, $Q_{DIVP}$ and $Q_{DIVM}$ signals from divider circuit 220. A solid line 510 shows the $I_{DIVP}$ signal without any VCO skew, and a dashed line 512 shows the $I_{DIVP}$ signal with a VCO skew of θ. A solid line 514 shows the $I_{DIVM}$ signal without any VCO skew, and a dashed line 516 shows the $I_{DIVM}$ signal with a VCO skew of θ. A solid line 520 shows the $Q_{DIVP}$ signal without any VCO skew, and a dashed line 522 shows the $Q_{DIVP}$ signal with a VCO skew of θ. A solid line 524 shows the $Q_{DIVM}$ signal without any VCO skew, and a dashed line 526 shows the $Q_{DIVM}$ signal with a VCO skew of θ. As shown in FIG. 5, for divider circuit 220 shown in FIG. 3, VCO skew affects the rising edges of the $I_{DIVP}$ and $Q_{DIVM}$ signals as well as the falling edges of the $I_{DIVM}$ and $Q_{DIVP}$ signals. The other edges of the $I_{DIVP}$, $I_{DIVM}$, $Q_{DIVP}$ and $Q_{DIVM}$ signals are not affected by VCO skew.

The bottom half of FIG. 5 shows the $I_{25P}$, $I_{25M}$, $Q_{25P}$ and $Q_{25M}$ signals from 25% duty cycle LO circuit 230. A solid line 530 shows the $I_{25P}$ signal without any VCO skew, and a dashed line 532 shows the $I_{25P}$ signal with a VCO skew of θ. A solid line 534 shows the $I_{25M}$ signal without any VCO skew, and a dashed line 536 shows the $I_{25M}$ signal with a VCO skew of θ. A solid line 540 shows the $Q_{25P}$ signal without any VCO skew and also with a VCO skew of θ. A solid line 544 shows the $Q_{25M}$ signal without any VCO skew, and a dashed line 546 shows the $Q_{25M}$ signal with a VCO skew of θ. As shown in FIG. 5, for divider circuit 220 and 25% duty cycle LO circuit 230 shown in FIG. 3, VCO skew affects the rising edges of the $I_{25P}$ signal, the falling edges of the $I_{25M}$ signal, and the rising and falling edges of the $Q_{25M}$ signal. The other edges of the $I_{25P}$, $I_{25M}$, $Q_{25P}$ and $Q_{25M}$ signals are not affected by VCO skew.

Figure 6A:
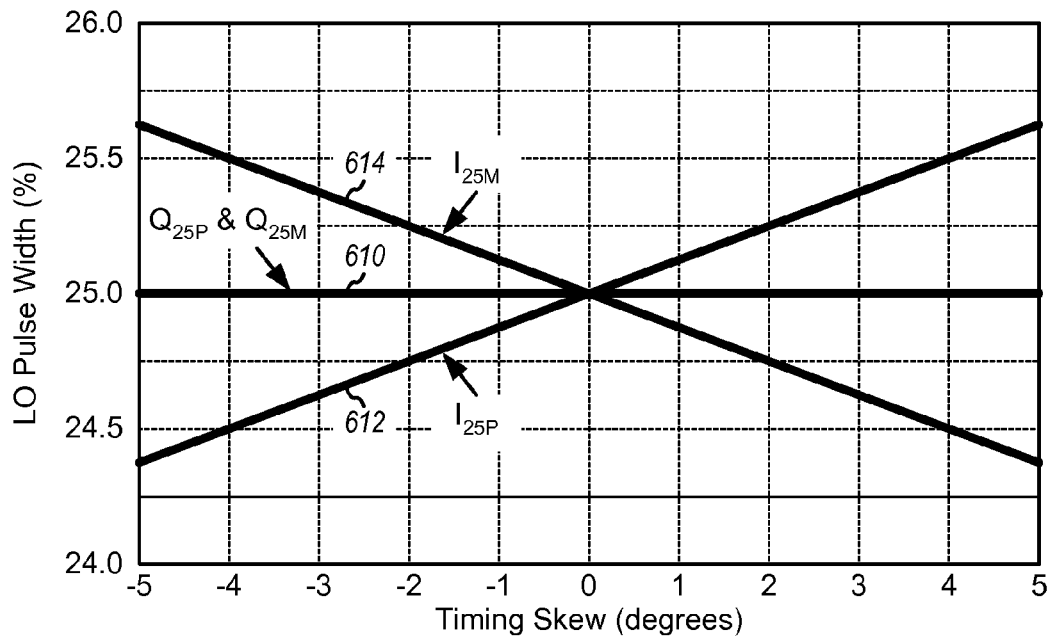
FIGS. 6A and 6B show plots of pulse widths and I/Q quadrature, respectively, of LO signals versus timing skew.

FIG. 6A shows plots of pulse widths of the $I_{25P}$, $I_{25M}$, $Q_{25P}$ and $Q_{25M}$ signals versus VCO skew. The pulse widths of the $Q_{25P}$ and $Q_{25M}$ signals are shown by a plot 610 and are not affected by VCO skew. The pulse width of the $I_{25P}$ signal is shown by a plot 612, and the pulse width of the $I_{25M}$ signal is shown by a plot 614. The pulse widths of the $I_{25P}$ and $I_{25M}$ signals are affected by VCO skew in the opposite manner. These effects result from changes in the $I_{DIVP}$, $I_{DIVM}$, $Q_{DIVP}$ and $Q_{DIVM}$ signals due to VCO skew shown in FIG. 5.

Figure 6B:
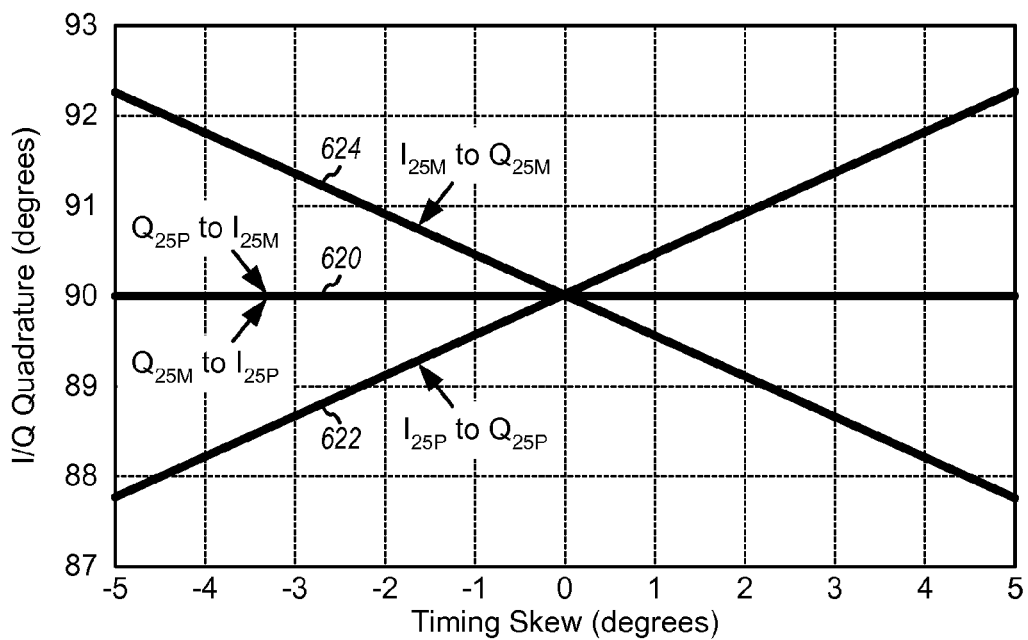

FIG. 6B shows plots of I/Q quadrature versus VCO skew. The phase difference between the $Q_{25P}$ and $I_{25M}$ signals and the phase difference between the $Q_{25M}$ and $I_{25P}$ signals are both shown by a plot 620 and are not affected by VCO skew. The phase difference between the $I_{25P}$ and $Q_{25P}$ signals is shown by a plot 622, and the phase difference between the $I_{25M}$ and $Q_{25M}$ signals is shown by a plot 624. The $I_{25P}$ to $Q_{25P}$ phase difference and the $I_{25M}$ to $Q_{25M}$ phase difference are affected by VCO skew in opposite manner. These effects result from changes in the $I_{DIVP}$, $I_{DIVM}$, $Q_{DIVP}$ and $Q_{DIVM}$ signals due to VCO skew shown in FIG. 5.

As shown in FIG. 6A, VCO skew can cause a difference between the pulse widths of the $I_{25P}$ and $I_{25M}$ signals, which may degrade IP2. As shown in FIG. 6B, VCO skew can also cause quadrature error between the $I_{25P}$, $I_{25M}$, $Q_{25P}$ and $Q_{25M}$ signals, which may degrade residual side band (RSB).

In an aspect, the differential input VCO signal may be deskewed or pre-distorted to correct for timing skew. For deskewing, the timing or phase of the $V_{INP}$ signal and/or the timing or phase of the $V_{INM}$ signal may be varied such that any inherent skew can be offset, and the phase difference can be brought back to approximately 180°. Deskewing may be achieved in various manners with various circuits.

Figure 7:
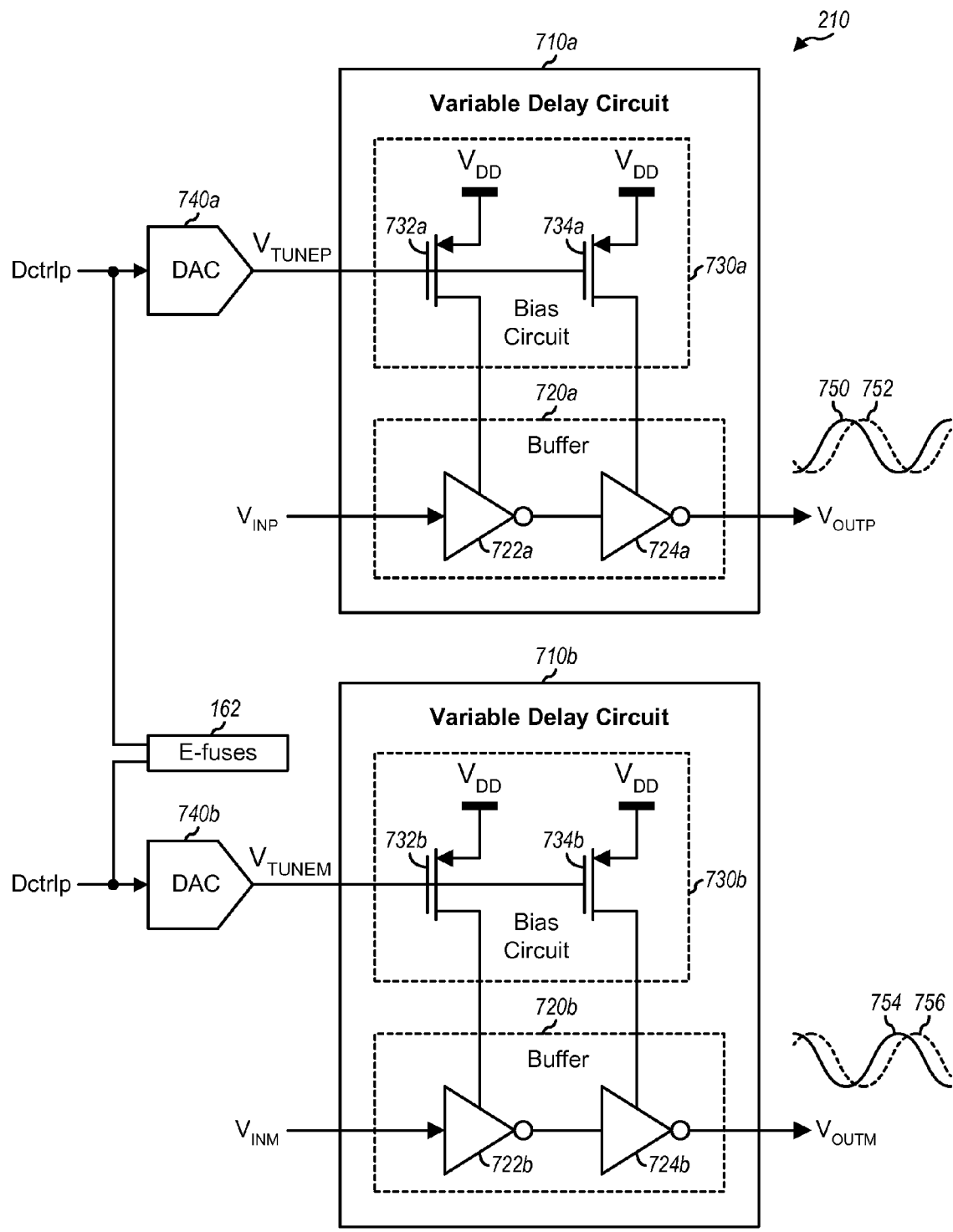
FIG. 7 shows a schematic diagram of an input deskew circuit.

FIG. 7 shows a schematic diagram of a design of input deskew circuit 210 in FIG. 2. In this design, input deskew circuit 210 includes variable delay circuits 710a and 710b for the P and M paths for the $V_{INP}$ and $V_{INM}$ signals, respectively. Each variable delay circuit 710 includes a buffer 720 and a bias circuit 730.

Within variable delay circuit 710a for the $V_{INP}$ signal, buffer 720a includes inverters 722a and 724a coupled in series, with inverter 722a receiving the $V_{INP}$ signal and inverter 724a providing the $V_{OUTP}$ signal. Bias circuit 730a includes P-channel metal oxide semiconductor (PMOS) devices 732a and 734a having their sources coupled to a power supply voltage $V_{DD}$, their gates receiving a $V_{TUNEP}$ control voltage, and their drains coupled to inverters 722a and 724a, respectively. A DAC 740a may generate the $V_{TUNEP}$ voltage (as shown in FIG. 7), or some other circuit may generate this control voltage.

Within variable delay circuit 710b for the $V_{INM}$ signal, buffer 720b includes inverters 722b and 724b coupled in series, with inverter 722b receiving the $V_{INM}$ signal and inverter 724b providing the $V_{OUTM}$ signal. Bias circuit 730b includes PMOS devices 732b and 734b having their sources coupled to the $V_{DD}$ voltage, their gates receiving a $V_{TUNEM}$ control voltage, and their drains coupled to inverters 722b and 724b, respectively. A DAC 740b may generate the $V_{TUNEM}$ voltage (as shown in FIG. 7), or some other circuit may generate this control voltage.

The deskewing or pre-distortion of the input VCO signal may be performed as follows. If the $V_{TUNEP}$ voltage is lowered, then PMOS devices 732a and 734a are turned on harder, and more bias current is provided to inverters 722a and 724a. This would result in faster slew rate and less delay through inverters 722a and 724a. The $V_{OUTP}$ signal would then observe less delay and would be shifted left relative to the $V_{OUTM}$ signal. The converse is true if the $V_{TUNEP}$ voltage is raised.

Similarly, if the $V_{TUNEM}$ voltage is lowered, then PMOS devices 732b and 734b are turned on harder, and more bias current is provided to inverters 722b and 724b. This would result in faster slew rate and less delay through inverters 722b and 724b. The $V_{OUTM}$ signal would then observe less delay and would be shifted left relative to the $V_{OUTP}$ signal. The converse is true if the $V_{TUNEM}$ voltage is raised.

A plot 750 shows the $V_{OUTP}$ signal with a low $V_{TUNEP}$ voltage, and a plot 752 shows the $V_{OUTP}$ signal with a high $V_{TUNEP}$ voltage. A plot 754 shows the $V_{OUTM}$ signal with a low $V_{TUNEM}$ voltage, and a plot 756 shows the $V_{OUTM}$ signal with a high $V_{TUNEM}$ voltage. Depending on the amount of timing skew and the direction of the skew, the $V_{TUNEP}$ and/or $V_{TUNEM}$ voltage may be varied to obtain 180° phase difference between the $V_{OUTP}$ and $V_{OUTM}$ signals.

FIG. 8 shows plots of the $V_{OUTM}$ signal for different amounts of delay. A dashed line 810 shows the $V_{OUTP}$ signal with a short delay obtained with a low $V_{TUNEP}$ voltage. Solid lines 820, 822 and 824 show the $V_{OUTM}$ signal with short, medium, and long delay obtained with low, medium, and high $V_{TUNEM}$ voltages, respectively. As shown in FIG. 8, the timing between the $V_{OUTP}$ and $V_{OUTM}$ signals may be varied by delaying one or both signals.

FIG. 7 shows one design of introducing a variable delay in the P and/or M path by varying the bias current of buffers 720a and/or 720b with PMOS devices. In another design, a variable delay may be introduced in the P and/or M path by varying the bias current of buffers 720a and/or 720b with N-channel MOS (NMOS) devices. For both designs, the control voltage at the gates of the PMOS or NMOS devices determines the slew rate and hence the delay through the buffer. In yet another design, a variable delay may be obtained by passing the $V_{INP}$ or $V_{INM}$ signal through a programmable number of inverters. A variable delay may also be obtained in other manners.

In the design shown in FIG. 7, variable delays may be introduced in the P and M paths with two variable delay circuits 710a and 710b. This design may allow for correction of a large range of timing skew. In another design, one path may have a fixed nominal delay, and the other path may have a variable delay covering a range from less than the nominal delay to greater than the nominal delay. For this design, only the path with the variable delay is adjusted to reduce timing skew.

Deskewing of the differential input VCO signal may be performed in various manners and may be dependent on the design of input deskew circuit 210. In one design, deskewing may be performed as follows for input deskew circuit 210 shown in FIG. 7. The bias voltages for I mixer 140a and Q mixer 140b in FIG. 1 may be set to nominal values. The $V_{TUNEP}$ voltage for bias circuit 730a may also be set to a nominal value. The $V_{TUNEM}$ voltage for bias circuit 730b may then be varied from one end (e.g., the lowest voltage) to the other end (e.g., the highest voltage). IP2 performance may be measured as the $V_{TUNEM}$ voltage is varied. The $V_{TUNEM}$ value that provides the highest IP2 may be retained and applied to bias circuit 730b. The $V_{TUNEP}$ voltage may then be varied from one end (e.g., the lowest voltage) to the other end (e.g., the highest voltage). IP2 performance may be measured as the $V_{TUNEP}$ voltage is varied. The $V_{TUNEP}$ value that provides the highest IP2 may be retained and applied to bias circuit 730a. Deskewing may be performed in the factory during the manufacturing phase of an IC containing LO signal generator 160. Deskewing may also be performed during testing phase of wireless device 100 and/or during some other phase.

IP2 calibration may be performed with or without VCO deskewing in order to obtain good or better IP2 performance. For IP2 calibration, bias circuits 146a and 146b in FIG. 1 may vary the bias voltages for I mixer 140a and Q mixer 140b, respectively, until the maximum IP2 or a sufficiently high IP2 is obtained.

Figure 9C:
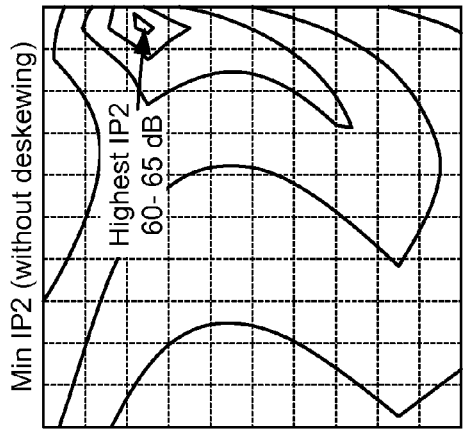
FIGS. 9A to 9F show plots of IP2 performance without and with deskewing.
Figure 9F:
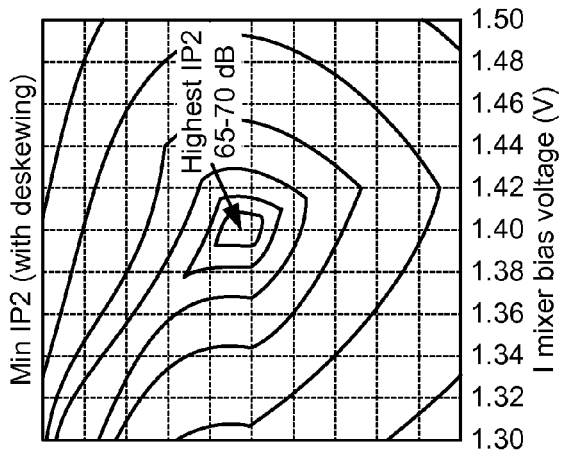
Figure 9B:
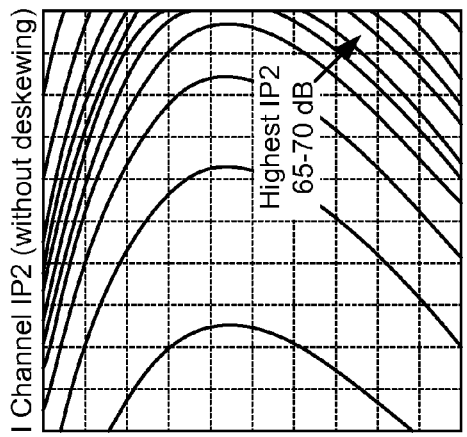
Figure 9E:
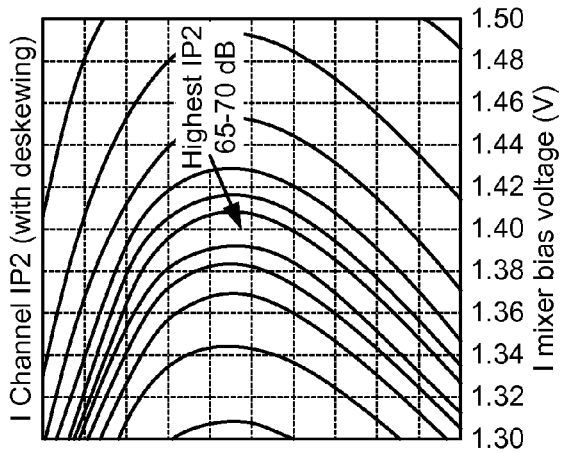
Figure 9A:
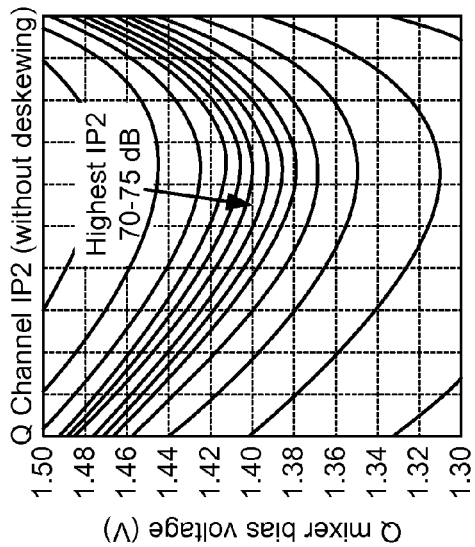

FIGS. 9A to 9C show contour plots of IP2 performance without VCO deskewing. For each of FIGS. 9A to 9C, the horizontal axis represents the bias voltage for I mixer 140a, which is referred to as the I bias voltage. The vertical axis represents the bias voltage for Q mixer 140b, which is referred to as the Q bias voltage.

FIG. 9A shows contour plots of IP2 performance for the Q channel for different combinations of I and Q bias voltages. Different IP2 values may be obtained for the Q channel for different combinations of I and Q bias voltages, with the highest IP2 being between 70 and 75 decibels (dB). FIG. 9A may be interpreted like a topographic map, with each contour away from the highest IP2 being 5 dB worse. FIG. 9B shows contour plots of IP2 performance for the I channel for different combinations of I and Q bias voltages, with the highest IP2 being between 65 and 70 dB. As shown in FIGS. 9A and 9B, the I and Q channels may have different contour plots. Thus, a given combination of I and Q bias voltages that provides good IP2 performance for the I channel may or may not provide good IP2 performance for the Q channel. FIG. 9C shows contour plots obtained by superimposing the contour plots in FIGS. 9A and 9B. FIG. 9C includes the lower of the two IP2 values from FIGS. 9A and 9B for each possible combination of I and Q bias voltages. As shown in FIG. 9C, the highest IP2 of 60 to 65 dB for both the I and Q channels may be obtained with an I bias voltage of approximately 1.49 volts (V) and a Q bias voltage of approximately 1.45V.

The contour plots for the I and Q channels are typically not known for the I and Q mixers on a given IC. IP2 calibration may thus be a 2-dimensional process in which IP2 may be measured for different combinations of I and Q bias voltages to determine the highest IP2 for both the I and Q channels. This 2-dimensional IP2 calibration process may be time consuming and may increase production time and cost.

VCO skew is a main contributor to IP2 degradation, especially in an LO architecture that uses a single-ended dynamic divider such as the one shown in FIGS. 2 and 3. VCO skew may be more severe if VCO 150 is implemented off-chip and LO signal generator 160 is implemented on-chip. In this case, the greater VCO skew may be due to board traces, package coupling etc. In general, existing timing skew in the differential input VCO signal may be deskewed to obtain a differential output VCO signal having approximately 180° phase difference, which may improve IP2 performance.

Figure 9D:
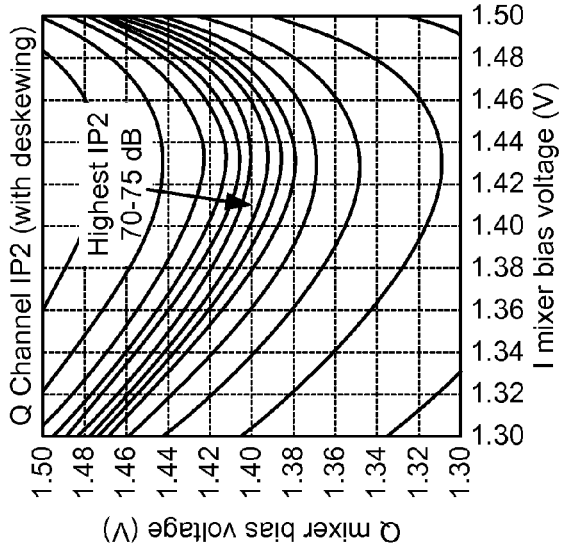

FIGS. 9D to 9F show contour plots of IP2 performance with VCO deskewing. FIG. 9D shows contour plots of IP2 performance for the Q channel for different combinations of I and Q bias voltages. FIG. 9E shows contour plots of IP2 performance for the I channel for different combinations of I and Q bias voltages. FIG. 9F shows contour plots obtained by superimposing the contour plots in FIGS. 9D and 9E. As shown in FIG. 9F, by performing VCO deskewing, the highest IP2 of 65 to 70 dB for both the I and Q channels may be obtained with nominal I and Q bias voltages of approximately 1.40V.

As shown in FIGS. 9B and 9E, VCO skew can cause a shift in the IP2 contours of one of the channels, which may then make IP2 calibration necessary. As shown in FIGS. 9C to 9F, by performing VCO deskewing, the shift in the IP2 contours of the one channel may be corrected, which may then eliminate the need for normal IP2 calibration of adjusting the I and Q bias voltages. IP2 calibration with a 2-dimensional process requiring adjustment of both the I and Q bias voltages may be replaced with VCO deskewing with a 1-dimensional process requiring adjustment of only the input VCO phase to minimize the timing error θ.

In another aspect, calibration data for IP2 calibration, VCO deskewing, RSB calibration, and/or other calibration on wireless device 100 may be stored in e-fuses on an IC. The ability to store calibration data in e-fuses may allow calibration to be performed as part of product test at the chip level during manufacturing. This may then eliminate the need for an OEM to perform calibration at the wireless device level, which may reduce test time and cost for the OEM.

In one design of IP2 calibration, an I DAC may generate the I bias voltage based on an Ictrl digital control, and a Q DAC may generate the Q bias voltage based on a Qctrl digital control. IP2 calibration may be performed (e.g., as described above for the 2-dimensional process) to vary the I and Q bias voltages with the DACs to obtain good IP2 performance for both the I and Q channels. Calibration data comprising the I and Q DAC values that provide good IP2 performance may be stored in e-fuses 148a and 148b, respectively, in FIG. 1.

In one design of VCO deskewing, DAC 740a in FIG. 7 may generate the $V_{TUNEP}$ voltage based on a Dctrlp digital control, and DAC 740b may generate the $V_{TUNEM}$ voltage based on a Dctrlm digital control. VCO deskewing may be performed as described above to vary the $V_{TUNEP}$ and $V_{TUNEM}$ voltages with DACs 740a and 740b to obtain good IP2 performance. Calibration data comprising the DAC values that provide for good IP2 performance may be stored in e-fuses 162, as shown in FIG. 7.

In general, any calibration data for any calibration may be stored in e-fuses. The calibration data may comprise one or more codes or values (e.g., one or more DAC values), depending on the type of calibration being performed.

In one aspect, an apparatus may include a deskew circuit and a divider circuit, e.g., as shown in FIG. 2. The apparatus may be an integrated circuit, a receiver, a transmitter, a wireless communication device, etc. The deskew circuit may receive a differential input oscillator signal having timing skew and provide a differential output oscillator signal having reduced timing skew. The divider circuit may divide the differential output oscillator signal in frequency and provide a differential I divided signal and a differential Q divided signal. The differential input oscillator signal may comprise first and second input oscillator signals, e.g., the $V_{INP}$ and $V_{INM}$ signals. The differential output oscillator signal may comprise first and second output oscillator signals, e.g., the $V_{OUTP}$ and $V_{OUTM}$ signals.

In one design, the deskew circuit may include a first variable delay circuit that receives the first input oscillator signal and provides the first output oscillator signal having an adjustable delay. The first variable delay circuit may include a first buffer and a first bias circuit, e.g., as shown in FIG. 7. The first buffer may receive the first input oscillator signal and provide the first output oscillator signal. The first bias circuit may provide a first variable bias current for the first buffer to adjust the delay of the first buffer. The first buffer may comprise multiple (e.g., two) inverters coupled in series. The first bias circuit may comprise at least one MOS device coupled to at least one inverter in the buffer and providing the variable bias current for the inverter(s). The deskew circuit may further include a second variable delay circuit that receives the second input oscillator signal and provides the second output oscillator signal having an adjustable delay. The second variable delay circuit may include a second buffer and a second bias circuit. The second buffer may receive the second input oscillator signal and provide the second output oscillator signal. The second bias circuit may provide a second variable bias current for the second buffer to adjust the delay of the second buffer.

The first bias circuit may generate the first variable bias current based on a first control voltage, e.g., the $V_{TUNEP}$ voltage in FIG. 7. The second bias circuit may generate the second variable bias current based on a second control voltage, e.g., the $V_{TUNEM}$ voltage in FIG. 7. The first and second control voltages may be set to reduce the timing skew in the differential output oscillator signal. The apparatus may include at least one e-fuse to store calibration data for the deskew circuit to obtain reduced timing skew for the differential output oscillator signal. The calibration data may be used to generate the first and second control voltages.

In one design, the divider circuit may include first and second pairs of inverters and a pair of switches, e.g., as shown in FIG. 3. The first pair of inverters may be coupled in series and may provide the differential I divided signal. The second pair of inverters may be coupled in series and may provide the differential Q divided signal. The pair of switches may be coupled between the first and second pairs of inverters. The divider circuit may be a single-ended dynamic divider and may operate on single-ended signals and have no logic storage element.

The apparatus may further include an LO circuit that receives the differential I and Q divided signals and provides first, second, third and fourth LO signals (e.g., the $I_{25P}$, $I_{25M}$, $Q_{25P}$ and $Q_{25M}$ signals) having 25% duty cycle and being 90 degrees out of phase. The apparatus may further include first and second mixers. The first mixer may downconvert an input RF signal with an I LO signal and provide an I downconverted signal. The second mixer may downconvert the input RF signal with a Q LO signal and provide a Q downconverted signal. The I and Q LO signals may be generated based on the differential I and Q divided signals, e.g., as shown in FIG. 3.

In another aspect, an integrated circuit may include an active circuit, a calibration circuit, and at least one e-fuse. The active circuit may receive at least one bias voltage or current provided to adjust the operation of the active circuit. The calibration circuit may receive calibration data and generate the at least one bias voltage or current in accordance with the calibration data. The at least one e-fuse may store the calibration data. The calibration circuit may comprise at least one DAC that receives the calibration data and provides at least one analog signal used to generate the at least one bias voltage or current for the active circuit.

In one design, the active circuit may comprise a downconversion mixer, the calibration circuit may comprise a bias circuit, and the calibration data may be determined based on IP2 performance of the mixer. In another design, the active circuit may comprise a deskew circuit, the calibration circuit may comprise a bias circuit, and the calibration data may be determined based on timing skew of a differential input oscillator signal.

FIG. 10 shows a design of a process 1000 for LO generation. A differential input oscillator signal having timing skew may be received (block 1012). A differential output oscillator signal having reduced timing skew may be generated based on the differential input oscillator signal (block 1014). The differential output oscillator signal may be divided in frequency (e.g., with a single-ended dynamic divider) to obtain a differential I divided signal and a differential Q divided signal (block 1016). In one design, calibration data for reducing timing skew of the differential output oscillator signal may be stored in at least one e-fuse (block 1018).

The differential input oscillator signal may comprise first and second input oscillator signals, and the differential output oscillator signal may comprise first and second output oscillator signals. In one design of block 1014, the first output oscillator signal may be generated with an adjustable delay based on the first input oscillator signal. This may be achieved by (i) buffering the first input oscillator signal with a first buffer to obtain the first output oscillator signal and (ii) adjusting the delay of the first buffer with a first variable bias current or voltage. In one design, the second output oscillator signal may be generated with an adjustable delay based on the second input oscillator signal. This may be achieved by (i) buffering the second input oscillator signal with a second buffer to obtain the second output oscillator signal and (ii) adjusting delay of the second buffer with a second variable bias current or voltage.

FIG. 11 shows a design of a process 1100 for performing deskewing. Delay of a first oscillator signal may be adjusted while fixing the delay of a second oscillator signal until a highest metric is obtained for the first oscillator signal (block 1112). The metric may be for IP2, RSP, etc. Delay of the first oscillator signal corresponding to the highest metric for the first oscillator signal may be determined (block 1114). Delay of the second oscillator signal may be adjusted while fixing the first oscillator signal at the determined delay until a highest metric is obtained for the second oscillator signal (block 1116). Delay of the second oscillator signal corresponding to the highest metric for the second oscillator signal may be determined (block 1118). The determined delays of the first and second oscillator signals may be stored for use during normal operation (block 1120).

The techniques and circuits described herein may be implemented on an IC, an analog IC, an RFIC, a mixed-signal IC, an ASIC, a printed circuit board (PCB), an electronics device, etc. The circuits may be fabricated with various IC process technologies such as complementary metal oxide semiconductor (CMOS), NMOS, PMOS, bipolar junction transistor (BJT), bipolar-CMOS (BiCMOS), silicon germanium (SiGe), gallium arsenide (GaAs), etc.

An apparatus implementing the techniques or circuits described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

What is claimed is:

1. An apparatus comprising:
   a deskew circuit operative to receive a differential input oscillator signal having timing skew and to provide a differential output oscillator signal having reduced timing skew; and
   a divider circuit coupled to the deskew circuit and operative to divide the differential output oscillator signal in frequency and to provide a differential inphase (I) divided signal and a differential quadrature (Q) divided signal;
   wherein the differential input oscillator signal comprises first and second input oscillator signals, wherein the differential output oscillator signal comprises first and second output oscillator signals, and wherein the deskew circuit comprises:
   a first variable delay circuit operative to receive the first input oscillator signal and provide the first output oscillator signal having an adjustable delay.

2. The apparatus of claim 1, wherein the first variable delay circuit comprises
   a buffer operative to receive the first input oscillator signal and provide the first output oscillator signal, and
   a bias circuit coupled to the buffer and operative to provide a variable bias current for the buffer to adjust delay of the buffer.

3. The apparatus of claim 2, wherein the buffer comprises multiple inverters coupled in series and operative to receive the first input oscillator signal and provide the first output oscillator signal, and wherein the bias circuit comprises at least one metal oxide semiconductor (MOS) device coupled to at least one inverter in the buffer and operative to provide the variable bias current for the at least one inverter.

4. The apparatus of claim 3, wherein the buffer comprises two inverters coupled in series, and wherein the bias circuit comprises two P-channel MOS (PMOS) devices or two N-channel MOS (NMOS) devices coupled to the two inverters in the buffer and operative to provide the variable bias current for the two inverters.

5. The apparatus of claim 1, wherein the deskew circuit further comprises
   a second variable delay circuit operative to receive the second input oscillator signal and provide the second output oscillator signal having an adjustable delay.

6. The apparatus of claim 5, wherein the first variable delay circuit comprises a first buffer operative to receive the first input oscillator signal and provide the first output oscillator signal, and a first bias circuit coupled to the first buffer and operative to provide a first variable bias current for the first buffer to adjust delay of the first buffer, and wherein the second variable delay circuit comprises a second buffer operative to receive the second input oscillator signal and provide the second output oscillator signal, and a second bias circuit coupled to the second buffer and operative to provide a second variable bias current for the second buffer to adjust delay of the second buffer.

7. The apparatus of claim 6, wherein the first bias circuit generates the first variable bias current based on a first control voltage, wherein the second bias circuit generates the second variable bias current based on a second control voltage, and wherein the first and second control voltages are selected to reduce timing skew in the differential output oscillator signal.

8. The apparatus of claim 1, wherein the divider circuit comprises
a first pair of inverters coupled in series and operative to provide the differential I divided signal,
a second pair of inverters coupled in series and operative to provide the differential Q divided signal, and
a pair of switches coupled between the first and second pairs of inverters.

9. The apparatus of claim 1, wherein the divider circuit operates on single-ended signals and has no logic storage element.

10. The apparatus of claim 1, further comprising:
a local oscillator (LO) circuit coupled to the divider circuit and operative to receive the differential I and Q divided signals and to provide first, second, third and fourth LO signals having 25% duty cycle and being 90 degrees out of phase.

11. The apparatus of claim 1, further comprising:
a first mixer operative to downconvert an input radio frequency (RF) signal with an I local oscillator (LO) signal and provide an I downconverted signal; and
a second mixer operative to downconvert the input RF signal with a Q LO signal and provide a Q downconverted signal, the I and Q LO signals being generated based on the differential I and Q divided signals.

12. The apparatus of claim 1, further comprising:
at least one electronics fuse (e-fuse) operative to store calibration data for the deskew circuit to obtain the reduced timing skew for the differential output oscillator signal.

13. The apparatus of claim 1, wherein the apparatus is an integrated circuit.

14. The apparatus of claim 1, wherein the apparatus is a wireless communication device.

15. A method comprising:
receiving a differential input oscillator signal having timing skew;
generating a differential output oscillator signal having reduced timing skew based on the differential input oscillator signal; and
dividing the differential output oscillator signal in frequency to obtain a differential inphase (I) divided signal and a differential quadrature (Q) divided signal;
wherein the differential input oscillator signal comprises first and second input oscillator signals, wherein the differential output oscillator signal comprises first and second output oscillator signals, and wherein the generating the differential output oscillator signal comprises generating the first output oscillator signal having an adjustable delay based on the first input oscillator signal.

16. The method of claim 15, wherein the generating the first output oscillator signal comprises
buffering the first input oscillator signal with a buffer to obtain the first output oscillator signal, and
adjusting delay of the buffer with a variable bias current or voltage.

17. The method of claim 15 wherein the generating the differential output oscillator signal further comprises generating the second output oscillator signal having an adjustable delay based on the second input oscillator signal.

18. The method of claim 17, wherein the generating the first output oscillator signal comprises buffering the first input oscillator signal with a first buffer to obtain the first output oscillator signal, and adjusting delay of the first buffer with a first variable bias current or voltage, and wherein the generating the second output oscillator signal comprises buffering the second input oscillator signal with a second buffer to obtain the second output oscillator signal, and adjusting delay of the second buffer with a second variable bias current or voltage.

19. The method of claim 15, wherein the dividing the differential output oscillator signal comprises dividing the differential output oscillator signal with a single-ended dynamic divider to obtain the differential I and Q divided signals.

20. The method of claim 15, further comprising:
storing calibration data for reducing timing skew of the differential output oscillator signal in at least one electronics fuse (e-fuse).

21. An apparatus comprising:
means for receiving a differential input oscillator signal having timing skew;
means for generating a differential output oscillator signal having reduced timing skew based on the differential input oscillator signal; and
means for dividing the differential output oscillator signal in frequency to obtain a differential inphase (I) divided signal and a differential quadrature (Q) divided signal;
wherein the differential input oscillator signal comprises first and second input oscillator signals, wherein the differential output oscillator signal comprises first and second output oscillator signals, and wherein the means for generating the differential output oscillator signal comprises means for generating the first output oscillator signal having an adjustable delay based on the first input oscillator signal.

22. The apparatus of claim 21, wherein the means for generating the first output oscillator signal comprises
means for buffering the first input oscillator signal to obtain the first output oscillator signal, and
means for adjusting delay of the first output oscillator signal with a variable bias current or voltage.

23. The apparatus of claim 21, wherein the means for generating the differential output oscillator signal further comprises means for generating the second output oscillator signal having an adjustable delay based on the second input oscillator signal.

* * * * *